(12) United States Patent
Huang et al.

(10) Patent No.: US 7,974,050 B2
(45) Date of Patent: Jul. 5, 2011

(54) LOADING REDUCTION DEVICE AND METHOD

(75) Inventors: Bo-Shih Huang, Kaohsiung (TW); Ming-Dou Ker, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 843 days.

(21) Appl. No.: 11/907,644

(22) Filed: Oct. 16, 2007

(65) Prior Publication Data

US 2009/0096432 A1 Apr. 16, 2009

(51) Int. Cl.
*H02H 9/00* (2006.01)
(52) U.S. Cl. .......................... 361/56; 361/91.1; 361/111
(58) Field of Classification Search .................. 361/56, 361/111, 91.1, 91.5, 58
See application file for complete search history.

(56) References Cited

U.S. PATENT DOCUMENTS

| | | | | |
|---|---|---|---|---|
| 4,586,104 A | * | 4/1986 | Standler | 361/119 |
| 5,719,427 A | * | 2/1998 | Tong et al. | 257/355 |
| 5,721,656 A | * | 2/1998 | Wu et al. | 361/56 |
| 5,946,176 A | * | 8/1999 | Ghoshal | 361/56 |
| 5,947,177 A | * | 9/1999 | Kratzer | 160/178.1 V |
| 5,969,929 A | * | 10/1999 | Kleveland et al. | 361/111 |
| 6,529,059 B1 | * | 3/2003 | Davis | 327/310 |
| 6,704,180 B2 | * | 3/2004 | Tyler et al. | 361/56 |
| 6,734,711 B1 | * | 5/2004 | Hinterscher | 327/309 |
| 7,005,939 B2 | | 2/2006 | Zerbe et al. | |
| 7,009,826 B2 | * | 3/2006 | Ker et al. | 361/56 |
| 7,218,792 B2 | * | 5/2007 | Raskar et al. | 382/254 |
| 7,384,854 B2 | * | 6/2008 | Voldman | 438/380 |

* cited by examiner

*Primary Examiner* — Patrick Salce
(74) *Attorney, Agent, or Firm* — Finnegan, Henderson, Farabow, Garrett & Dunner, LLP

(57) ABSTRACT

An active loading-reduction device is provided for a circuit. The circuit has functional circuitry coupled to a terminal to receive an alternating voltage. The circuit also has an electrostatic discharge protector that is coupled to the terminal. The active loading-reduction device includes active circuitry that is adapted to be coupled to a power supply to provide a reactance to counteract a reactance provided by the electrostatic discharge protector at the terminal of the circuit.

18 Claims, 9 Drawing Sheets

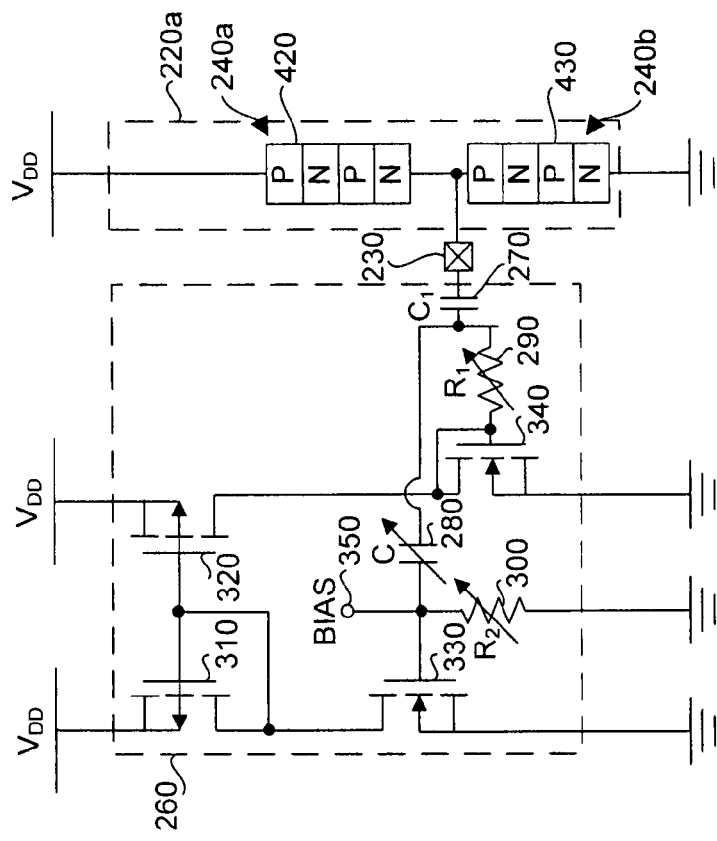
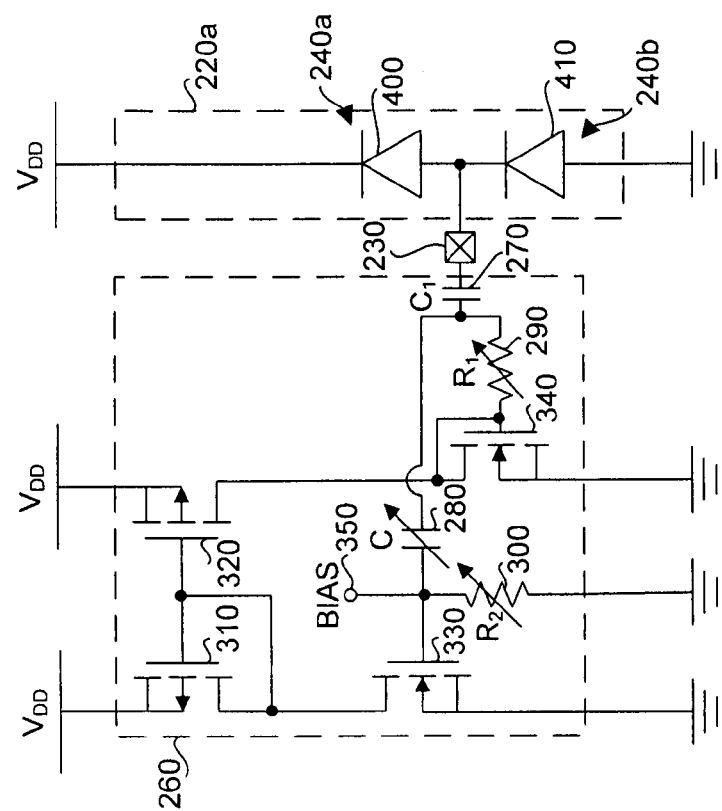
FIGURE 4B
FIGURE 4A

LOADING REDUCTION DEVICE AND METHOD

TECHNICAL FIELD

This invention generally relates to reducing loading on a circuit.

BACKGROUND

Circuits, such as integrated circuits (ICs), are commonly susceptible to damage by electrostatic discharge (ESD). For example, a functional component such as a metal-oxide-semiconductor field effect transistor (MOSFET) in an IC may have two functional elements that are separated by an epitaxial layer between the elements. When an ESD current enters one of these elements, the ESD current can damage the epitaxial layer such that the MOSFET becomes non-functional. Thus, an ESD protector may be implemented in a circuit to prevent an ESD current from entering the functional component.

FIG. 1 is a schematic diagram of a conventional IC 100 with functional circuitry 110 connected to an input or output terminal 120. A signal having one or more frequencies is applied at terminal 120 to engage functional circuitry 110. IC 100 may be connected to a power supply that includes a high-voltage power terminal and a low-voltage power terminal. In FIG. 1, the high-voltage terminal is shown as $V_{DD}$ and the low-voltage terminal is shown as electrical ground. In addition, a $V_{DD}$-to-$V_{SS}$ ESD clamp 130 may be provided to direct an ESD current at the high-voltage or low-voltage terminal to the opposite terminal.

An ESD protector 140 is implemented in IC 100 to divert ESD current from terminal 120 of IC 100 away from functional circuitry 110 while allowing the signal applied at terminal 120 to pass to functional circuitry 110. By diverting the ESD current away from functional circuitry 110, ESD protector 140 protects functional circuitry 110 from undesirable exposure the ESD current. For example, ESD protector 140 may be connected, in parallel with functional circuitry 110, to terminal 120 of IC 100. ESD protector 140 may include input/output (I/O) ESD clamps 150a, 150b to clamp a high-voltage ESD to the high-voltage power terminal, or alternatively to clamp a low-voltage ESD to the low-voltage power terminal. Each of I/O ESD clamps 150a, 150b of ESD protector 140 may include a component that is adapted to transmit a signal that has a voltage greater than or less than a predetermined threshold value. For example, each of I/O ESD clamps 150a, 150b may include a diode or a field effect transistor (FET).

Meanwhile, the advancement of the design and manufacture of functional circuitry has resulted in functional circuitry with increased operating frequencies. For example, as the sizes of ICs have been scaled down, the operating frequencies of ICs have increased. However, ESD protector 140 commonly presents a parasitic capacitance to terminal 120 that undesirably filters the signal applied at terminal 120 as the signal passes to functional circuitry 110. For example, the diodes or FETs of I/O ESD clamps 150a, 150b may have parasitic capacitances. The parasitic capacitance of ESD protector 140 typically acts as a low-pass filter on the signal at terminal 120, producing an undesirable amount of high-frequency loss of the signal. In addition, ESD protectors that are more robust to larger ESD currents may result in more undesirable high-frequency loss than less robust ESD protectors. Thus, as the operating frequencies of the functional circuitry have increased, the parasitic capacitance of ESD protector 140 has become an increasingly significant problem.

A conventional ESD protector attempts to mitigate this problem by distributing ESD elements, such as diodes, along a transmission line between an input/output terminal and functional circuitry. Impedance components are arranged between the ESD elements to decrease the filtering effect of the ESD protector while still permitting clamping of a large current. However, this "distributed" ESD protector may consume an undesirably large amount of space. For example, the distributed ESD protector may consume space approximately in proportion to the number of distributed ESD elements. The distributed ESD protector may also not sufficiently decrease the filtering effect for certain implementations of functional circuitry.

In alternative conventional ESD protectors, an inductor is implemented in the ESD protector to lessen the filtering of the signal. The inductor includes a conductor arranged in a coil to generate a magnetic field when current is passed through the coil. However, the inductor may require specialized manufacturing processes and may also consume an undesirably large amount of space. The operation of the inductor may also cause undesirable magnetic or electric field disturbances in neighboring circuitry. These disturbances may become more acute as circuit size decreases or operating frequencies increase.

SUMMARY

An active loading-reduction device is provided for a circuit. The circuit comprises functional circuitry coupled to a terminal to receive an alternating voltage and an electrostatic discharge protector coupled to the terminal. The active loading-reduction device comprises active circuitry that is adapted to be coupled to a power supply to provide a reactance to counteract a reactance provided by the electrostatic discharge protector at the terminal of the circuit.

A circuit comprises functional circuitry coupled to a terminal to receive an alternating voltage. An electrostatic discharge protector is coupled to the terminal to protect the functional circuitry from an electrostatic discharge received at the terminal, the electrostatic discharge protector providing a reactance at the terminal. The circuit further comprises an active loading-reduction device comprising active circuitry. The active circuitry of the active loading-reduction device is adapted to be coupled to a power supply to provide a reactance to counteract the reactance provided by the electrostatic discharge protector.

A method is provided of actively reducing loading in a circuit. The circuit comprises functional circuitry coupled to a terminal to receive a voltage and an electrostatic discharge protector coupled to the terminal to protect the functional circuitry from an electrostatic discharge received at the terminal. The method comprises receiving an alternating voltage at the terminal. A first reactance is provided at the terminal as a result of protecting the functional circuitry from an electrostatic discharge. The method further comprises providing a second reactance to counteract the first reactance by coupling the voltage to active circuitry, the active circuitry being coupled to a power supply.

BRIEF DESCRIPTION OF THE DRAWINGS

The accompanying drawings, which are incorporated in and constitute a part of this specification, illustrate embodiments of the invention and, together with the description, serve to explain advantages and principles of the invention. In the drawings:

FIGS. 4A, 4B, and 4C are schematic diagrams of exemplary embodiments of active-loading reduction devices and ESD protectors;

DESCRIPTION OF THE EMBODIMENTS

Reference will now be made in detail to embodiments of the invention, examples of which are illustrated in the accompanying drawings. Wherever possible, the same reference numbers will be used throughout the drawings to refer to the same or like parts.

A circuit comprises functional circuitry having a plurality of electronic components and electrical connections between the electronic components. The electronic components typically comprise active and passive electronic components. For example, the circuit may comprise resistors, capacitors, and/or transistors. In one embodiment, the circuit is implemented as an IC. The IC may use very large scale integration (VLSI) or ultra large scale integration (ULSI), indicating the degree of spatial density of transistors in a single IC. Typically, the IC is incorporated into a monolithic structure, such as a semiconductor "chip."

Figure 1:
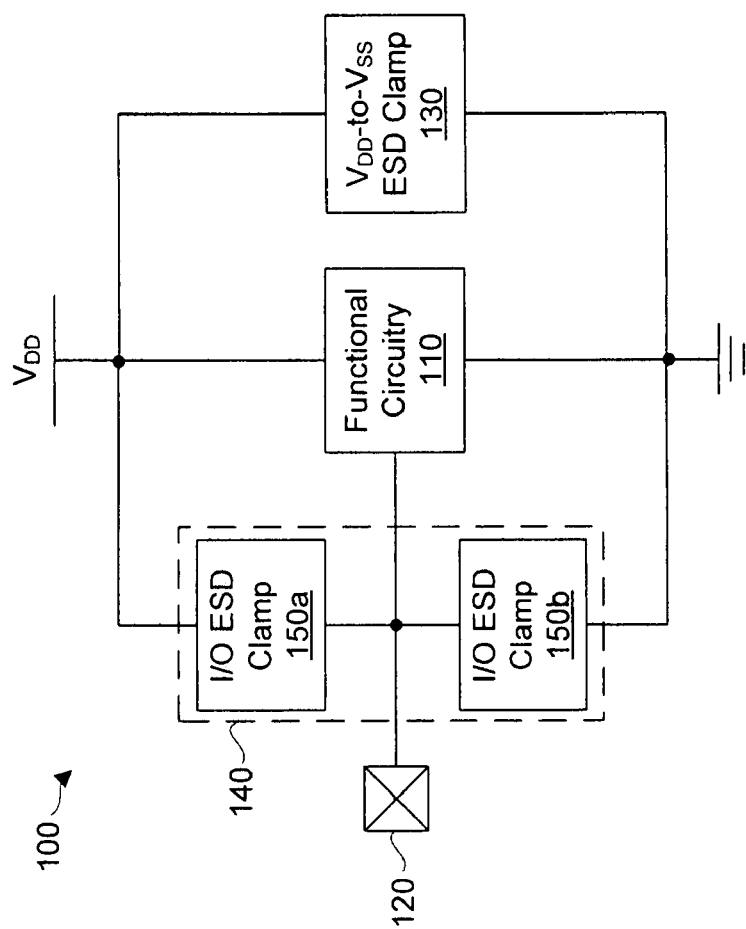
FIG. 1 is a schematic diagram of an exemplary conventional circuit having functional circuitry and an ESD protector.
Figure 2A:
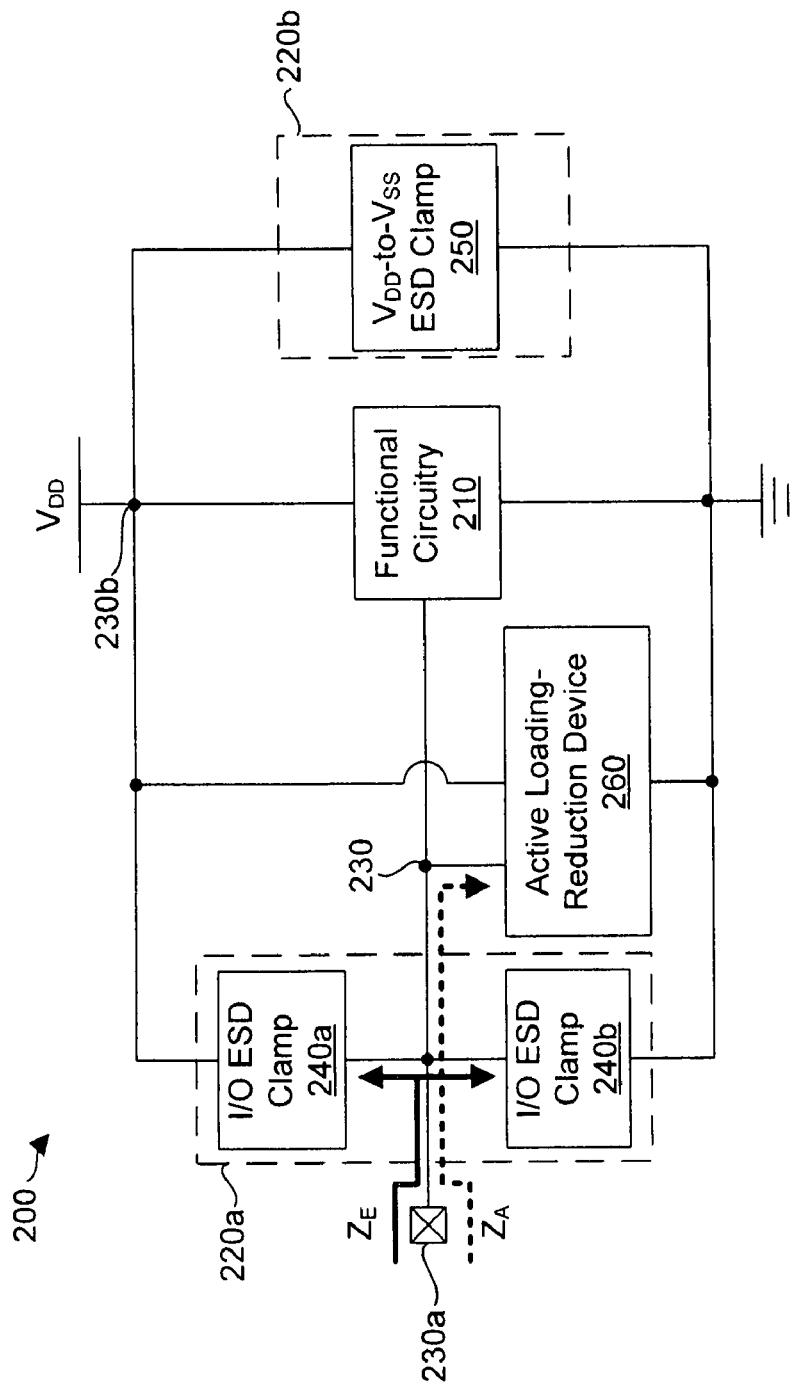
FIG. 2A is a schematic diagram of an exemplary embodiment of a circuit with functional circuitry, first and second ESD protectors, and an active loading-reduction device to reduce a load imposed by the first ESD protector.

FIG. 2A is a schematic diagram of an exemplary embodiment of a circuit 200 having functional circuitry 210 coupled to an input or output terminal 230a to receive a signal. Functional circuitry 210 includes one or more functional electronic components that together enable the functionality of circuit 200. Functional circuitry 210 may also be connected to terminals of a power supply to receive direct current (DC) or alternating current (AC) power from the power supply. In FIG. 2A, functional circuitry 210 is shown as connected to a high-voltage power terminal held at a voltage $V_{DD}$ and to a low-voltage power terminal held at electrical ground. The terminals may include a conductor or semiconductor that enables electrical coupling to one or more components of functional circuitry 210. For example, if circuit 200 is an IC, a terminal may be implemented as a pad of the IC.

One or more ESD protectors 220a, 220b may be coupled to one or more terminals of functional circuitry 210, such as terminal 230a or terminal 230b, to protect functional circuitry 210 of IC 200 from ESD current that may arise at these terminals. ESD protectors 220a, 220b may be coupled to terminals 230a and 230b, respectively. ESD protectors 220a, 220b of FIG. 2A are provided only to illustrate embodiments of the invention, and should not be used to limit the scope of the invention or its equivalents to the exemplary embodiments provided herein. The ESD may emanate from a human body, a tool, or another body capable of accumulating a positive or negative electric charge. The ESD may be received by circuit 200 at one of terminals 230a, 230b of circuit 200 or at another region of circuit 200. If circuit 200 is an IC, ESD protectors 220a, 220b may be incorporated into the same chip that implements the IC.

ESD protectors 220a, 220b detect the presence at terminals 230a, 230b of an ESD current that could endanger functional circuitry 210 of circuit 200. ESD protectors 220a, 220b may be coupled to terminals 230a, 230b of IC 200, such as in parallel with functional circuitry 210, to detect whether any voltages at terminals 230a, 230b are at a level that threatens functional circuitry 210. For example, ESD protectors 220a, 220b may be implemented near terminals 230a, 230b of IC 200 to protect IC 200 from an ESD current that could be introduced at terminals 230a, 230b. If ESD protectors 220a, 220b do not detect the presence of an ESD current, ESD protectors 220a, 220b may allow the voltages or currents at terminals 230a, 230b to pass to functional circuitry 210. However, if the presence of an ESD is detected, the relevant one of ESD protectors 220a, 220b may divert the ESD current through the ESD protector and therefore away from functional circuitry 210. Thus, ESD protectors 220a, 220b are capable of protecting IC 200 from the ESD substantially without impairing the functionality of IC 200.

ESD protector 220a may include one or more I/O ESD clamps to direct the ESD current at terminal 230a to either the high-voltage power terminal or the low-voltage power terminal. For example, an I/O ESD clamp 240b may couple an ESD current that occurs at a voltage greater than an upper threshold value to the low-voltage power terminal, and an I/O ESD clamp 240a may couple an ESD current that occurs at a voltage less than a lower threshold value to the high-voltage power terminal. Each of I/O ESD clamps 240a, 240b may include one or more electronic components that are adapted to transmit a signal with a voltage that is greater than or less than a threshold value. For example, each of I/O ESD clamps 240a, 240b may include diodes, transistors (such as field effect transistors (FETs) or bipolar junction transistors (BJTs)), or other suitable components for passing ESD current. Each of I/O ESD clamps 240a, 240b may include additional active or passive electronic components, such as resistors.

ESD protector 220b of circuit 200 may include a $V_{DD}$-to-$V_{SS}$ ESD clamp 250 to protect functional circuitry 210 from an ESD current that may arise at the high-voltage power terminal or at the low-voltage power terminal. For example, an ESD current may originate at a power supply that supplies power to the high-voltage and low-voltage power terminals. If $V_{DD}$-to-$V_{SS}$ ESD clamp 250 detects an ESD current at either of the power terminals, it may direct the ESD current to the other power terminal, substantially bypassing functional circuitry 210. By diverting the ESD current, $V_{DD}$-to-$V_{SS}$ ESD clamp 250 protects functional circuitry 210 from an ESD current at the high-voltage or low-voltage power terminal.

ESD protector 220a may present a parasitic capacitance that acts as an undesirable load on the signal at terminal 220a. If the parasitic capacitance of ESD protector 240a is represented as '$C_E$', then ESD protector 220a may provide an impedance '$Z_E$' at terminal 220a. The impedance '$Z_E$' may have a reactance term '$jX_E$' that loads any AC components of the signal at terminal 220a. The reactance term '$jX_E$' may be approximated as shown in Equation 1:

$$jX_E \cong \frac{1}{j\omega C_E}. \quad (1)$$

The parasitic capacitance '$C_E$' of ESD protector 220a may cause ESD protector 220a in the context of circuit 200 to behave as a low-pass filter on the signal at terminal 230a. ESD protector 220a may filter out undesirably large amounts of high-frequency components of the signal. For example, ESD protector 220a may attenuate the signal to undesirably low levels at operating frequencies of functional circuitry 210.

One or more active loading-reduction devices, such as active loading-reduction device 260, may be provided to actively reduce the load imposed by ESD protector 220a on the signal at terminal 230a. Active loading-reduction device 260 may be connected at point 230. ESD protector 220a may provide the first reactance '$X_E$', which tends to filter the signal at terminal 230a, and active loading-reduction device 260 may provide a second reactance '$X_A$' to counteract the first reactance. Active loading-reduction device 260 may include active circuitry that is coupled to one or more power supplies to actively provide the second reactance '$X_A$'. For example, active loading-reduction device 260 may be coupled to the high-voltage power terminal and the low-voltage power terminal, respectively, as shown in FIG. 2A, to power the active circuitry of active loading-reduction device 260. The active circuitry includes one or more active electronic components and may also include one or more passive electronic components.

Figure 2B:
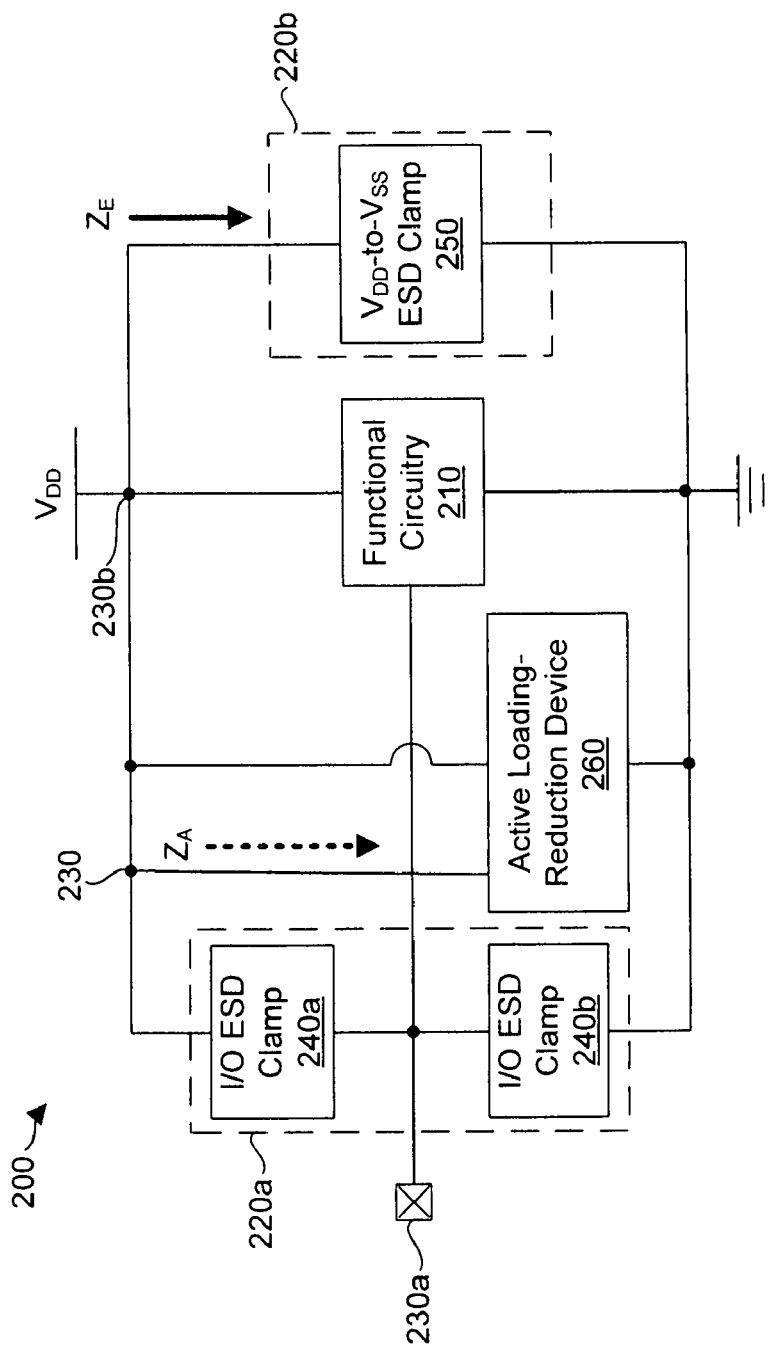
FIG. 2B is a schematic diagram of an exemplary embodiment of a circuit with functional circuitry, first and second ESD protectors, and an active loading-reduction device to reduce a load imposed by the second ESD protector.

FIG. 2B is a schematic diagram of another exemplary embodiment of circuit 200. ESD protector 220b may present a parasitic capacitance that acts as an undesirable load on the voltage at terminal 230b. Similarly to the example shown in FIG. 2A, ESD protector 220b may provide an impedance '$Z_E$' at terminal 230b. The impedance '$Z_E$' may have a reactance term '$jX_E$' that loads any AC components of the voltage at terminal 230b. One or more active loading-reduction devices, such as active loading-reduction device 260, may be provided to actively reduce the load imposed by ESD protector 220b on the voltage at terminal 230b by providing a second reactance '$X_A$' to counteract the first reactance '$X_E$'. For example, a first active loading-reduction device may be coupled to terminal 230a to reduce the load imposed by ESD protector 220a and a second active loading-reduction device may be coupled to terminal 230b to reduce the load imposed by ESD protector 220b.

Active loading-reduction device 260 may be implemented without an inductor. For example, active loading-reduction device 260 may be implemented with one or more active and/or passive electronic components that do not include an inductor. An inductor would include a conductor arranged in a coil to generate a magnetic field when current is passed through the coil. Active loading-reduction device 260 can provide several advantages when implemented absent any inductor. For example, active loading-reduction device 260, when implemented without an inductor, may be manufactured to have a desirable size and shape. Active loading-reduction device 260 may also be implemented in circuit 200 without requiring any specialized manufacturing processes for structures constituting an inductor. In addition, active loading-reduction device 260, when implemented without an inductor, may produce less magnetic field disturbance during operation than an inductor would produce. These advantages may be especially desirable if the circuit is implemented as an IC. For example, the IC may need to be manufactured within certain size constraints or within certain tolerances to magnetic or electric field disturbances.

Figure 3:
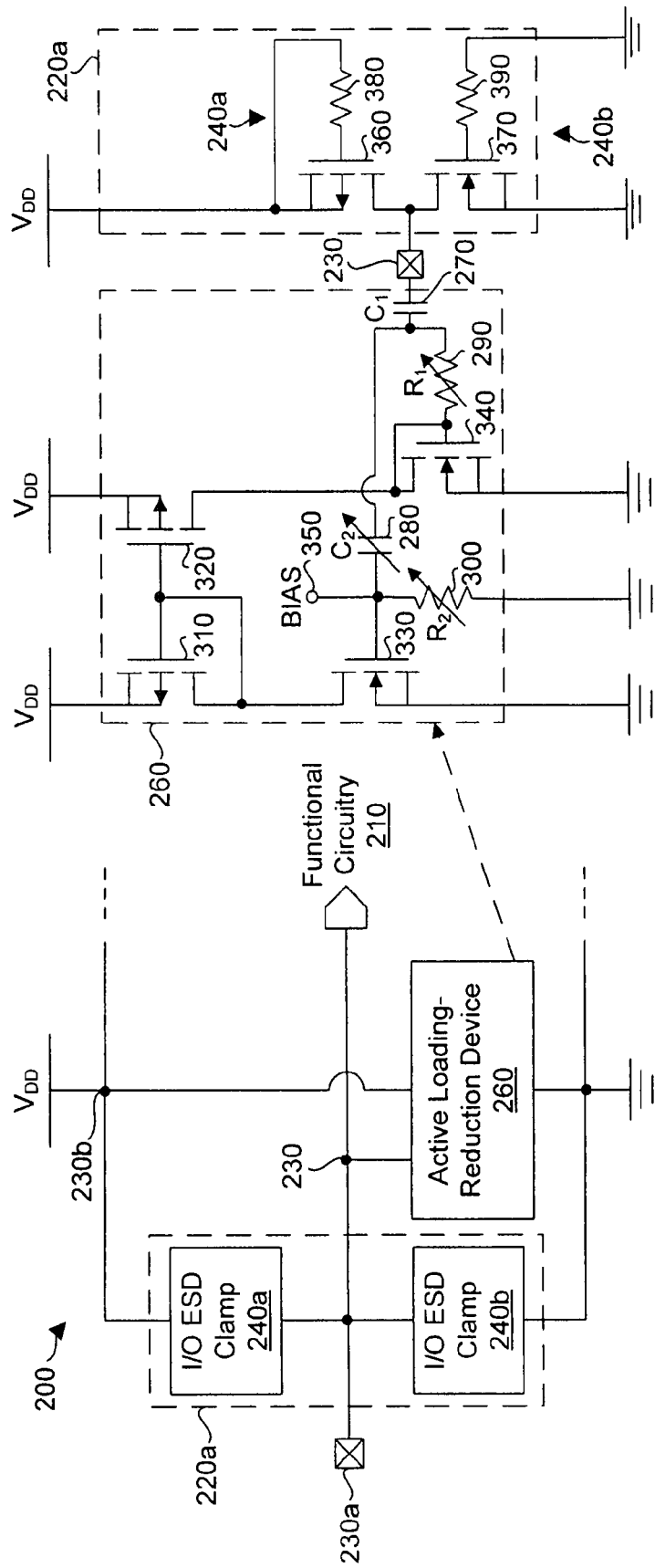
FIG. 3 is a schematic diagram of a section of the circuit shown in FIG. 2, with exploded views of exemplary embodiments of the active loading-reduction device and the ESD protector.

FIG. 3 is a schematic diagram of a section of circuit 200 of FIG. 2A, showing exploded views of exemplary embodiments of active loading-reduction circuit 260 and ESD protector 220a. Each of active loading-reduction circuit 260 and ESD protector 220a of FIG. 3 is provided only to illustrate embodiments consistent with the invention, and should not be used to limit the scope of the invention or its equivalents to the exemplary embodiments provided herein. In the exemplary embodiments of FIG. 3, each of active loading-reduction circuit 260 and ESD protector 220a is implemented using one or more of each of transistors, capacitors, and resistors.

Active loading-reduction device 260 may be adapted to be adjustable to tune the load-reducing effect of active loading-reduction device 260. For example, active loading-reduction device 260 may be adjusted to reduce a load on terminal 220 to be approximately equivalent to the load that would be presented on terminal 220 by an equivalent capacitor with a capacitance value of less than about 200 fF, wherein one of the terminals of this equivalent capacitor is coupled to terminal 220 and the other terminal is coupled to the low-voltage power terminal. In one exemplary embodiment, the load on terminal 220 may be reduced to the effective capacitance of less than about 200 fF at a frequency of a signal of about 2 GHz.

To enable adjustment of its load-reducing effect, active loading-reduction device 260 may include at least one variable electronic component having a variable value, such that varying the value of the variable electronic component varies the reactance provided by active loading-reduction device 260. For example, active loading-reduction device 260 may have at least one variable capacitor and at least one variable resistor. A variable resistor implemented in an IC may comprise, for example, a metal-semiconductor field effect transistor (MESFET).

In the exemplary embodiment shown in FIG. 3, active loading-reduction device 260 has a non-variable capacitor 270, a variable capacitor 280, a first variable resistor 290, and a second variable resistor 300. Although variable electronic components are used for variable capacitor 280, first variable resistor 290, and second variable resistor 300 to provide adjustability of the load-reducing effect of active loading-reduction device 260, electronic components that are non-variable may also be used in place of variable capacitor 280, first resistor 290, and second resistor 300. First, second, third, and fourth transistors are also provided. The first, second, third, and fourth transistors in this exemplary embodiment are a first p-channel MOSFET 310, a second p-channel MOSFET 320, a first n-channel MOSFET 330, and a second n-channel MOSFET 340.

In the exemplary embodiment shown in FIG. 3, the sources of first and second p-channel MOSFETs 310, 320 are coupled to the high-voltage power terminal. The gates of first and second p-channel MOSFETs 310, 320 are coupled to the drains of first p-channel MOSFET 310 and first n-channel MOSFET 330. The sources of first and second n-channel MOSFETs 330, 340 are coupled to the low-voltage power terminal. The gate of first n-channel MOSFET 330 is coupled to a first terminal of variable capacitor 280 and to a first terminal of second variable resistor 300. A second terminal of second variable resistor 300 is coupled to the low-voltage power terminal. The drain of second n-channel MOSFET 340 is coupled to the drain of second p-channel MOSFET 320, to a first terminal of first variable resistor 290, and to a gate of second n-channel MOSFET 340. A second terminal of variable capacitor 280 and a second terminal of first variable resistor 290 are coupled to a first terminal of non-variable capacitor 270. A second terminal of non-variable capacitor 270 is coupled to terminal 230.

Active loading-reduction device 260 may provide an impedance having a reactance term '$jX_A$' such that, based on certain embodiments of active loading-reduction device 260, one can make a useful mathematical approximation of this reactance term. For example, for the exemplary embodiment shown in FIG. 3, one may make the approximation shown in Equation 2:

$$Z_A \cong R_1 + j\omega R_1 R_2 C_2 \quad (2)$$

The reactance term '$jX_A$' of this impedance is the '$j\omega R_1 R_2 C_2$' term. As shown in FIG. 3, '$C_2$' is the capacitance of variable capacitor 280, '$R_1$' is the resistance of the first variable resistor 290, and '$R_2$' is the resistance of the second variable resistor 300. By varying the values '$C_2$', '$R_1$', and '$R_2$' of variable electronic components 280, 290, and 300, respectively, the value of reactance '$X_A$' can be varied to counteract the reactance provided '$X_E$' by ESD protector 230a to an appropriate degree.

For example, one or more of the capacitance value of variable capacitor 280, and the resistance values of first and second variable resistors 290, 300, respectively, may be varied in real time to provide a reactance '$X_A$' that is approximately equal and opposite to the reactance '$X_E$' provided by ESD protector 230a. Setting '$X_A$' from Equation 2 equal to negative '$X_E$' from Equation 1, the target frequency '$\omega$' may be represented by Equation 3:

$$\omega = \frac{1}{\sqrt{R_1 R_2 C_2 C_E}} \quad (3)$$

The target frequency '$\omega$' represents a central frequency at which the reactance '$X_A$' provided by active loading-reduction device 260 maximally counteracts the reactance '$X_E$' provided by ESD protector 220a. In a domain around the target frequency '$\omega$', active loading-reduction device 260 may protect the signal at terminal 230 from diminishment by ESD protector 220a such that the signal can pass to functional circuitry 210 without being diminished below a predetermined level.

In addition, active loading-reduction device 260 may have a bias terminal 350 at which a bias voltage can be applied to adjust operational characteristics of active loading-reduction device 260. The bias voltage at bias terminal 350 may be select based on one or both of a voltage at the high-voltage power terminal and a voltage at the low-voltage power terminal to insure a desired operation of active loading-reduction device 260.

In the exemplary embodiment of ESD protector 220a illustrated in FIG. 3, I/O ESD clamp 240a includes a p-channel MOSFET 360 and I/O ESD clamp 240b includes an n-channel MOSFET 370. A first resistor 380 may be provided to couple the gate and source of p-channel MOSFET 360 to each other, and a second resistor 390 may be provided to couple the gate of n-channel MOSFET 370 to the low-voltage power terminal.

Figure 4C:
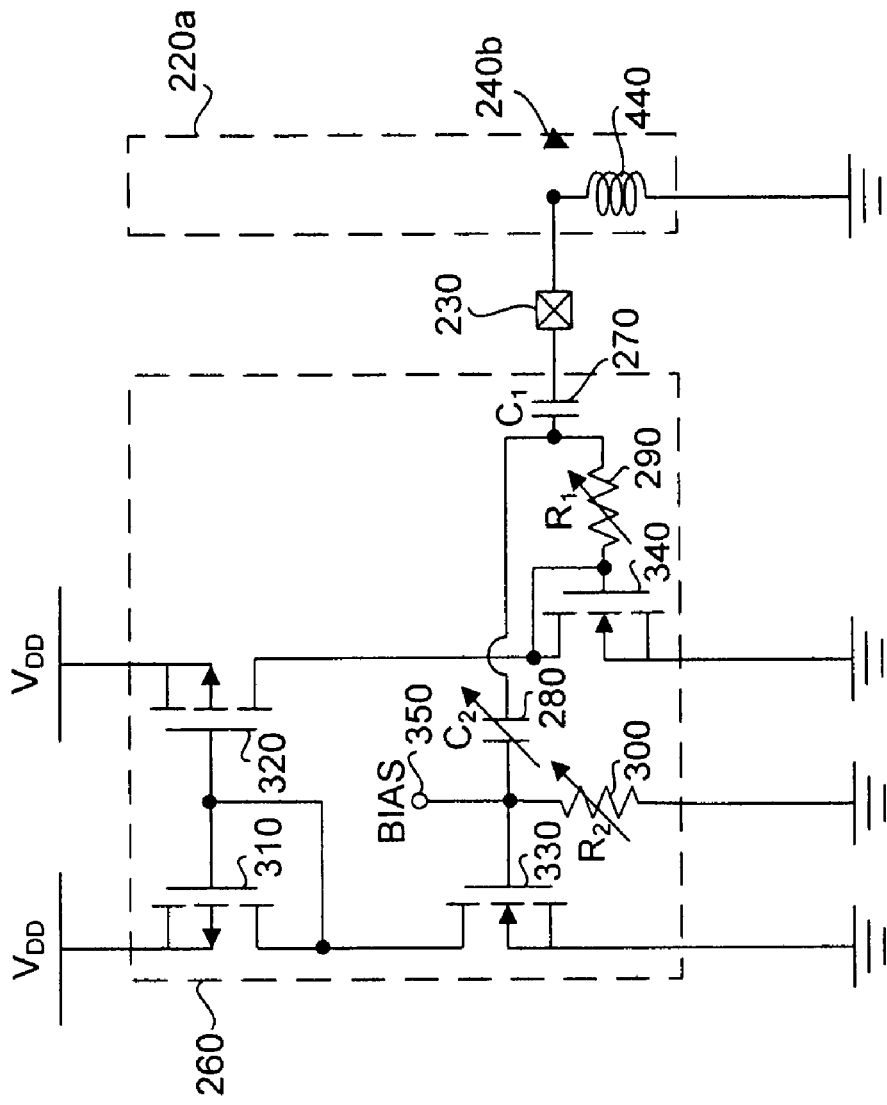

Additional exemplary embodiments of ESD protector 220a, implementing alternative exemplary embodiments of I/O ESD clamp 240a and/or I/O ESD clamp 240b, are illustrated in FIGS. 4A, 4B, and 4C. In FIG. 4A, I/O ESD clamp 240a includes a first diode 400, and I/O ESD clamp 240b includes a second diode 410. As shown in FIG. 4A, first diode 400 and second diode 410 may be coupled in series in a reverse-biased orientation relative to the high-voltage and low-voltage power terminals to implement ESD protector 220a.

In FIG. 4B, I/O ESD clamp 240a includes a first double PN junction 420 and I/O ESD clamp 240b includes a second double PN junction 430. Each of first and second double PN junctions 420, 430 includes a first PN junction and a second PN junction coupled in series and in the same orientation. For example, first and second PN junctions may be implemented by two diodes or two transistors, such as FETs or BJTs. As shown in FIG. 4B, first double PN junction 420 and second double PN junction 430 may be coupled in series in a reverse-biased orientation relative to the high-voltage and low-voltage power terminals to implement ESD protector 220a.

In FIG. 4C, yet another embodiment of ESD protector 220a is illustrated. I/O ESD clamp 240b includes an inductor 440. In this embodiment, ESD protector 220a may not include I/O ESD clamp 240a, which is coupled to the high-voltage power terminal in the embodiments illustrated in FIGS. 3, 4A, and 4B.

Figure 5B:
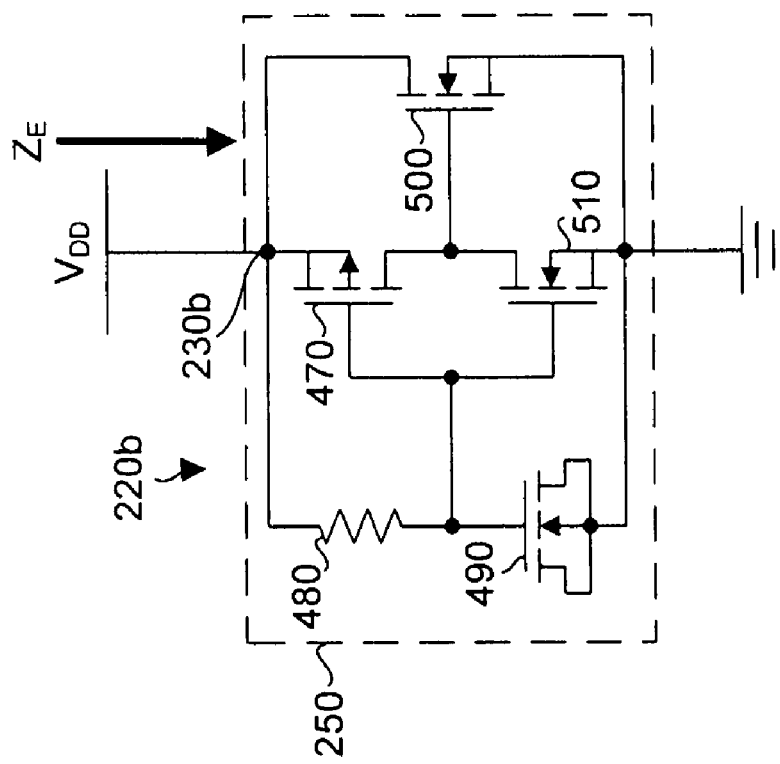
FIGS. 5A and 5B are schematic diagrams of exemplary embodiments of ESD protectors.
Figure 5A:
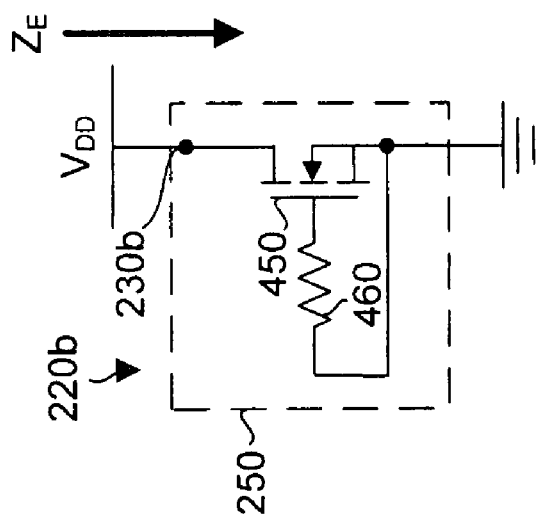

FIGS. 5A and 5B are schematic diagrams of exemplary embodiments of $V_{DD}$-to-$V_{SS}$ ESD clamp 250 of ESD protector 220b. As shown in FIGS. 5A and 5B, an impedance '$Z_E$' is provided by $V_{DD}$-to-$V_{SS}$ ESD clamp 250 at terminal 230b. As described above, active loading-reduction device 260 (such as shown in FIG. 2B) may be provided to counteract the reactance portion impedance '$Z_E$' with an impedance '$Z_A$'. ESD protector 220b of FIG. 5A and ESD protector 220b of FIG. 5B are provided only to illustrate embodiments consistent with the invention, and should not be used to limit the scope of the invention or its equivalents to the exemplary embodiments provided herein. In the exemplary embodiments of FIGS. 5A and 5B, ESD protector 220b is implemented using one or more of each of transistors, capacitors, and resistors.

In the exemplary embodiment shown in FIG. 5A, $V_{DD}$-to-$V_{SS}$ ESD clamp 250 includes an n-channel metal-oxide-semiconductor FET (MOSFET) 450 and a resistor 460. The drain of n-channel MOSFET 450 is coupled to the high-voltage power terminal. The source of n-channel MOSFET 450 is coupled to a first terminal of resistor 460 and to the low-voltage power terminal. The gate of n-channel MOSFET 450 is coupled to a second terminal of resistor 460.

In the exemplary embodiment shown in FIG. 5B, $V_{DD}$-to-$V_{SS}$ ESD clamp 250 includes a p-channel MOSFET 470, a resistor 480, and first, second, and third n-channel MOSFETs 490, 500, and 510. A first terminal of resistor 480, the source of p-channel MOSFET 470, and the drain of second n-channel MOSFET 500 are coupled to the high-voltage power terminal. The source and drain of first n-channel MOSFET 490, the source of second n-channel MOSFET 500, and the source of third n-channel MOSFET 510 are coupled to the low-voltage power terminal. A second terminal of resistor 480 is coupled to the gates of first n-channel MOSFET 490, third n-channel MOSFET 510, and p-channel MOSFET 470. The gate of second n-channel MOSFET 500 is coupled to the drain of p-channel MOSFET 470 and to the drain of third n-channel MOSFET 510.

Figure 6:
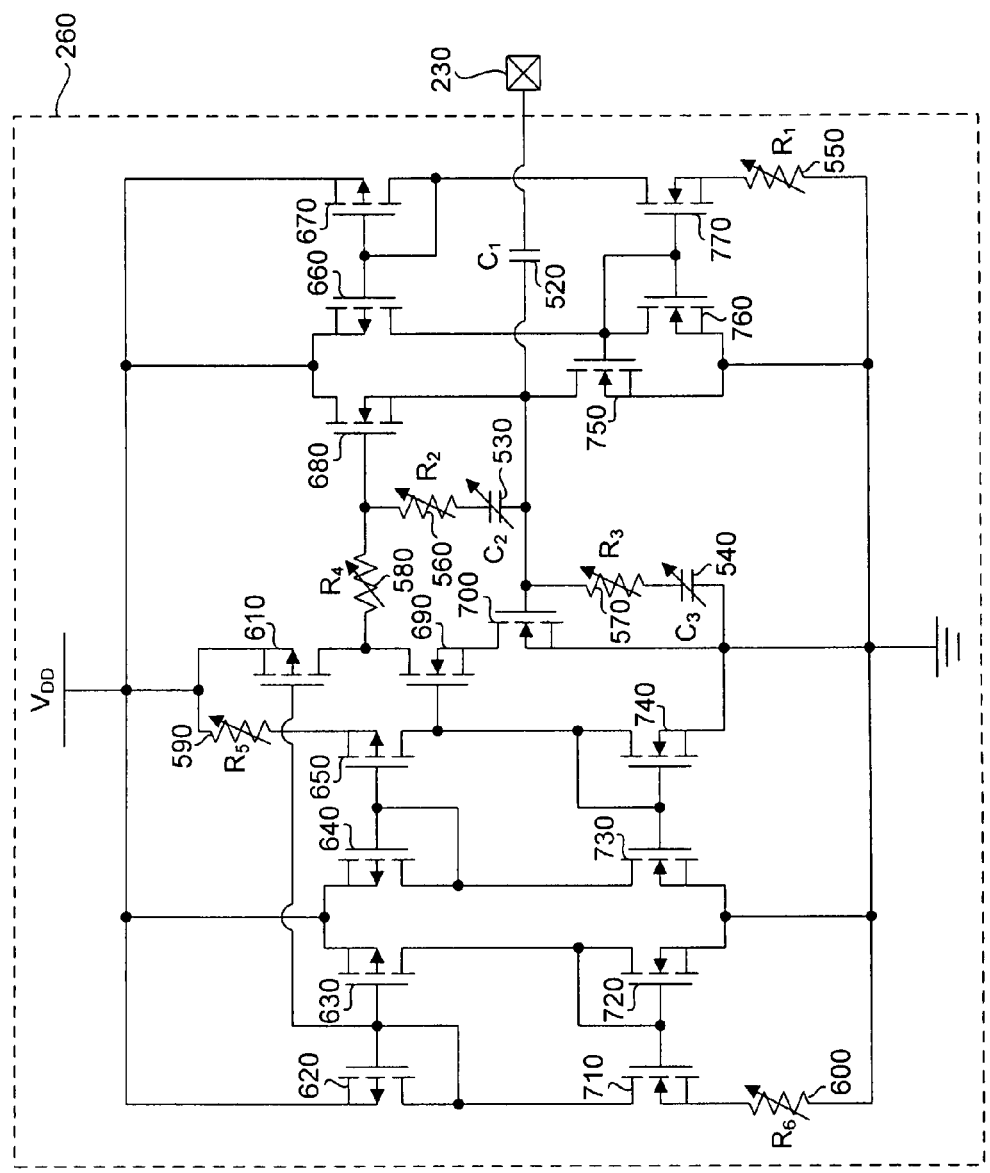
FIG. 6 is a schematic diagram of an exemplary embodiment of an active loading-reduction device.

FIG. 6 is a schematic diagram of another exemplary embodiment of active loading-reduction circuit 260. FIG. 6 is provided only to illustrate an embodiment consistent with the invention, and should not be used to limit the scope of the invention or its equivalents to the exemplary embodiments provided herein. In the exemplary embodiment of FIG. 6, active loading-reduction circuit 260 is implemented using one or more of each of transistors, capacitors, and resistors.

In the exemplary embodiment shown in FIG. 6, active loading-reduction device 260 has a non-variable capacitor 520, a first variable capacitor 530, a second variable capacitor 540, a first variable resistor 550, a second variable resistor 560, a third variable resistor 570, a fourth variable resistor 580, a fifth variable resistor 590, and a sixth variable resistor 600. Although variable electronic components are used for variable capacitors 530 and 540 and for variable resistors 550, 560, 570, 580, 590, and 600 to provide adjustability of the load-reducing effect of active loading-reduction device 260, electronic components that are non-variable may also be used for these components. Seventeen transistors are also provided. The seventeen transistors in this exemplary embodiment include seven p-channel MOSFETs and ten n-channel MOSFETs. The seven p-channel MOSFETs are labeled as first through seventh p-channel MOSFETs 610, 620, 630, 640, 650, 660, and 670, respectively. The ten n-channel MOSFETs are labeled as first through tenth n-channel MOSFETs 680, 690, 700, 710, 720, 730, 740, 750, 760, and 770, respectively.

In the exemplary embodiment shown in FIG. 6, the sources of first, second, third, fourth, sixth, and seventh p-channel MOSFETs 610, 620, 630, 640, 660, and 670, respectively, are coupled to the high-voltage power terminal. The gates of first, second, and third p-channel MOSFETs 610, 620, and 630, respectively, are coupled to the drain of second p-channel MOSFET 620 and to the drain of fourth n-channel MOSFET 710. The gates of fourth and fifth p-channel MOSFETs 640 and 650, respectively, are coupled to the drain of fourth p-channel MOSFET 640 and to the drain of sixth n-channel MOSFET 730. A first terminal of fifth variable resistor 590 is coupled to the high-voltage power terminal, and a second terminal of fifth variable resistor 590 is coupled to the source of fifth p-channel MOSFET 650. The gates of sixth and seventh p-channel MOSFETs 660 and 670, respectively, are coupled to the drain of seventh p-channel MOSFET 670 and to the drain of tenth n-channel MOSFET 770. The drain of first n-channel MOSFET 680 is coupled to the high-voltage power terminal, and the source of first n-channel MOSFET 680 is coupled to the drain of eighth n-channel MOSFET 750 and to a first terminal of non-variable capacitor 520.

The drain of fourth n-channel MOSFET 710 is coupled to a first terminal of sixth variable resistor 600. A second terminal of sixth variable resistor 600 is coupled to the low-voltage power terminal. The sources of third, fifth, sixth seventh, eighth, and ninth, n-channel MOSFETs 700, 720, 730, 740, 750, and 760, respectively, are coupled to the low-voltage power terminal. The gates of fourth and fifth n-channel MOSFETs 710 and 720, respectively, are coupled to the drain of fifth n-channel MOSFET 720 and to the drain of third p-channel MOSFET 630. The gates of sixth and seventh n-channel MOSFETs 730 and 740, respectively, are coupled to the drain of seventh n-channel MOSFET 740, to the drain of fifth p-channel MOSFET 650, and to the gate of second n-channel MOSFET 690. The gates of eighth, ninth, and tenth n-channel MOSFETs 750, 760, and 770, respectively, are coupled to the drain of ninth n-channel MOSFET 760 and to the drain of sixth p-channel MOSFET 660.

The drain of first p-channel MOSFET 610 is coupled to the drain of second n-channel MOSFET 690 and to a first terminal of fourth variable resistor 580. A second terminal of fourth variable resistor 580 is coupled to a first terminal of second variable resistor 560 and to the gate of first n-channel MOSFET 680. A second terminal of second variable resistor 580 is coupled to a first terminal of first variable capacitor 530. The source of second n-channel MOSFET 690 is coupled to the drain of third n-channel MOSFET 700. The gate of third n-channel MOSFET 700 is coupled to a first terminal of third variable resistor 570, to a second terminal of first variable capacitor 530, and to the first terminal of non-variable capacitor 520. The second terminal of third variable resistor 570 is coupled to a first terminal of second variable capacitor 540. A second terminal of second variable capacitor 540 is coupled to the low-power voltage terminal. A second terminal of non-variable capacitor 520 is coupled to terminal 230 of active loading-reduction device 260.

Figure 7C:
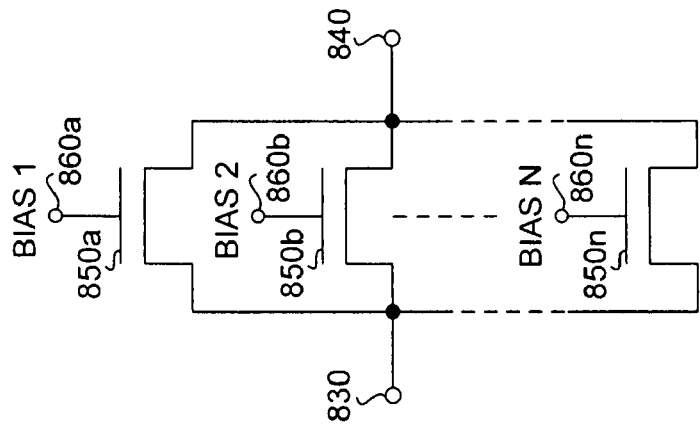
FIGS. 7B and 7C are schematic diagrams of exemplary embodiments of variable resistors that may be implemented in an active loading-reduction device.
Figure 7A:
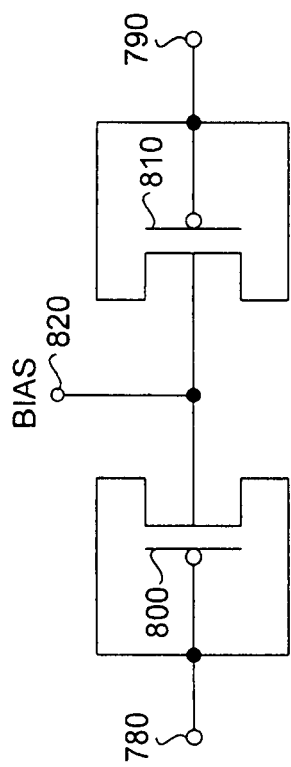
FIG. 7A is a schematic diagram of an exemplary embodiment of a variable capacitor that may be implemented in an active loading-reduction device.

FIG. 7A is a schematic diagram of an exemplary embodiment of an implementation of a variable capacitor having a first terminal 780 and a second terminal 790. This embodiment of the variable capacitor may be used for one or more of variable capacitor 280 shown in FIGS. 3, 4A, 4B, and 4C, and variable capacitors 530 and 540 shown in FIG. 6. The variable capacitor may include a first FET 800 and a second FET 810. As shown in FIG. 7A, the gate of first FET 800 may be coupled to the source of first FET 800, to the drain of first FET 800, and to first terminal 780. The gate of second FET 810 may be coupled to the source of second FET, to the drain of second FET 810, and to second terminal 790. The substrates of first and second FETs 800, 810 may be coupled together and used as a bias terminal 820 to which a preselected bias voltage can be applied to adjust the effective capacitance of the variable capacitor.

Figure 7B:
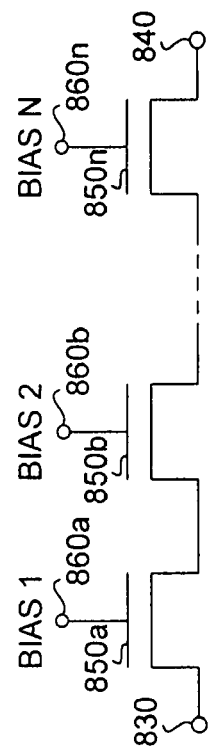

FIGS. 7B and 7C are schematic diagrams of exemplary embodiments of implementations of a variable resistor having a first terminal 830 and a second terminal 840. These embodiments of the variable resistor may be used for one or more of variable resistors 290, 300 shown in FIGS. 3, 4A, 4B, and 4C or variable resistors 550, 560, 570, 580, 590, and 600 shown in FIG. 6. In FIG. 7B, the variable resistor includes a plurality of FETs 850a, 850b, . . . , and 850n coupled in series, where N=n may be any number selected to achieve desirable resistive properties. The drain of one of FETs 850a, 850b, . . . , and 850n may be coupled to the source of an adjacent FET, connecting the drains and sources of the FETs in series. The gates of FETs 850a, 850b, . . . , 850n may be used as bias terminals 860a, 860b, . . . , and 860n to which preselected bias voltages can be applied to adjust the effective resistance of the variable resistor.

In FIG. 7C, the variable resistor includes FETs 850a, 850b, . . . , and 850n coupled in parallel, where N=n may be any number selected to achieve desirable resistive properties. The drain of one of FETs 850a, 850b, . . . , 850n may be coupled to the drain of an adjacent FET, and the source of one of FETs 850a, 850b, . . . , 850n may be coupled to the source of an adjacent FET, connecting the drains and sources of the FETs in parallel. The gates of FETs 850a, 850b, . . . , 850n may be used as bias terminals 860a, 860b, . . . , and 860n to which preselected bias voltages can be applied to adjust the effective resistance of the variable resistor.

The variable capacitor shown in FIG. 7A and the variable resistors shown in FIGS. 7B and 7C are provided only to illustrate embodiments consistent with the invention, and should not be used to limit the scope of the invention or its equivalents to the exemplary embodiments provided herein. In the exemplary embodiments of FIGS. 7A, 7B, and 7C, variable capacitors and variable resistors are implemented using one or more of each of transistors, capacitors, and resistors.

As explained above, the active loading-reduction device may reduce the load imposed by one or more of the ESD protectors on the input or output terminal of the circuit. The active loading-reduction device may reduce the load without the implementation of an inductor. Moreover, one may adjust a target frequency at which the active loading-reduction device can reduce the load on the terminal to below a predetermined level.

Although embodiments consistent with the present invention have been described in considerable detail with regard to embodiments thereof, other versions are possible. For example, the active loading-reduction device and the ESD protector may comprise other electronic structures equivalent in function to the illustrative structures herein. Furthermore, relative or positional terms, such as "first," "second," and "third," are used with respect to the exemplary embodiments and are interchangeable. Therefore, the appended claims should not be limited to the description of the versions contained herein.

What is claimed is:

1. An active loading-reduction device for use with an electronic circuit and an electrostatic discharge protector, comprising:
   a power input connection for receiving a supply of power; and
   an active circuit coupled to the power input connection and providing a reactance at a terminal to counteract a reactance provided by the electrostatic discharge protector,
   wherein the electronic circuit is coupled to the terminal to receive an alternating voltage, and
   wherein the active loading-reduction device does not comprise an inductor.

2. An active loading-reduction device according to claim 1, wherein the active circuit comprises at least one variable electronic component having a variable value, and wherein varying the value of the variable electronic component varies the reactance provided by the active loading-reduction device.

3. An active loading-reduction device according to claim 2, wherein the variable electronic components comprise a variable capacitor.

4. An active loading-reduction device according to claim 2, wherein the variable electronic components comprise a variable resistor.

5. An active loading-reduction device according to claim 1, wherein the active circuit is adapted to provide a reactance that has at least a predetermined value at frequencies of the received voltage of from about 3 GHz to about 6 GHz.

6. An active loading-reduction device according to claim 1, wherein the active circuit is adapted to reduce a load on the terminal to be approximately equivalent to a load that would be presented on the terminal by a capacitor with a capacitance value of less than about 200 fF.

7. A circuit comprising:
   an electronic circuit coupled to a terminal to receive an alternating voltage;
   an electrostatic discharge protector coupled to the terminal to protect the electronic circuit from an electrostatic discharge received at the terminal, the electrostatic discharge protector providing a reactance at the terminal; and
   an active loading-reduction device comprising an active circuit adapted to be coupled to a power supply and providing a reactance to counteract the reactance provided by the electrostatic discharge protector,
   wherein the active loading-reduction device does not comprise an inductor.

8. A circuit according to claim 7, wherein the active loading-reduction device comprises at least one variable electronic component having a variable value, and wherein varying the value of the variable electronic component varies the reactance provided by the active loading-reduction device.

9. A circuit according to claim 8, wherein the variable electronic components comprise a variable capacitor.

10. A circuit according to claim 8, wherein the variable electronic components comprise a variable resistor.

11. A circuit according to claim 7, wherein the active loading-reduction device is adapted to provide a reactance that has at least a predetermined value at frequencies of the received voltage of from about 3 GHz to about 6 GHz.

12. A circuit according to claim 7, wherein the active loading-reduction device is adapted to reduce a load on the terminal to be approximately equivalent to a load that would be presented on the terminal by a capacitor with a capacitance value of less than about 200 fF.

13. A circuit according to claim 7, wherein the circuit is an integrated circuit.

14. A method of actively reducing loading in a circuit, the circuit comprising an electronic circuit coupled to a terminal to receive a voltage and an electrostatic discharge protector coupled to the terminal to protect the electronic circuit from an electrostatic discharge received at the terminal, the method comprising:
   (a) receiving an alternating voltage at the terminal;
   (b) providing a first reactance at the terminal as a result of protecting the electronic circuit from an electrostatic discharge; and
   (c) providing a second reactance to counteract the first reactance by coupling the voltage to an active circuit, the active circuit being coupled to a power supply,
   wherein the active circuit does not comprise an inductor.

15. A method according to claim 14, wherein the active circuit comprises at least one variable electronic component having a variable value, the method further comprising varying the value of the variable electronic component to vary the second reactance.

16. A method according to claim 15, wherein the variable electronic components comprise a variable capacitor, the method comprising varying the value of the variable capacitor to vary the second reactance.

17. A method according to claim 15, wherein the variable electronic components comprise a variable resistor, the method comprising varying the value of the variable resistor to vary the second reactance.

18. A method according to claim 14, wherein (c) comprises providing the second reactance to have at least a predetermined value at frequencies of the voltage of from about 3 GHz to about 6 GHz.

* * * * *